US012813177B2

(12) United States Patent
Sato et al.

(10) Patent No.: US 12,813,177 B2
(45) Date of Patent: Nov. 24, 2026

(54) METHOD OF MANUFACTURING SILICON NITROGENEOUS FILM

(71) Applicant: Merck Patent GmbH, Darmstadt (DE)

(72) Inventors: Atsuhiko Sato, Kakegawa (JP); Ralph R. Dammel, Branchburg, NJ (US); Takashi Fujiwara, Kakegawa (JP); Mansour Moinpour, Branchburg, NJ (US)

(73) Assignee: MERCK PATENT GMBH, Darmstadt (DE)

(*) Notice: Subject to any disclaimer, the term of this patent is extended or adjusted under 35 U.S.C. 154(b) by 0 days.

(21) Appl. No.: 18/037,341

(22) PCT Filed: Nov. 17, 2021

(86) PCT No.: PCT/EP2021/081913

§ 371 (c)(1),
(2) Date: May 17, 2023

(87) PCT Pub. No.: WO2022/106436

PCT Pub. Date: May 27, 2022

(65) Prior Publication Data

US 2023/0420244 A1 Dec. 28, 2023

Related U.S. Application Data

(60) Provisional application No. 63/116,474, filed on Nov. 20, 2020.

(51) Int. Cl.
*H10P 14/694* (2026.01)
*H10P 14/60* (2026.01)

(52) U.S. Cl.
CPC .... *H10P 14/69433* (2026.01); *H10P 14/6319* (2026.01); *H10P 14/6532* (2026.01); *H10P 14/6538* (2026.01); *H10P 14/6539* (2026.01); *H10P 14/6689* (2026.01)

(58) Field of Classification Search
CPC .................................................. H01L 21/0217
See application file for complete search history.

(56) References Cited

U.S. PATENT DOCUMENTS

| | | | | |
|---|---|---|---|---|
| 4,743,662 | A | 5/1988 | Lipowitz | |
| 5,093,096 | A | 3/1992 | Okamura et al. | |
| 5,773,100 | A | 6/1998 | Chang et al. | |
| 6,426,127 | B1 * | 7/2002 | Ross | H01L 21/02282 528/21 |
| 10,563,093 | B2 | 2/2020 | Nojima et al. | |
| 2009/0111283 | A1 | 4/2009 | Kim et al. | |
| 2009/0289284 | A1 | 11/2009 | Goh et al. | |
| 2013/0029057 | A1 * | 1/2013 | Laksin | B05D 3/147 427/520 |
| 2019/0136088 | A1 * | 5/2019 | Nojima | C09D 183/16 |
| 2020/0211838 | A1 | 7/2020 | Muramatsu et al. | |

FOREIGN PATENT DOCUMENTS

| | | | | |
|---|---|---|---|---|
| CN | 102470637 | A | 5/2012 | |
| CN | 103930472 | A | 7/2014 | |
| JP | 07-206410 | A | 8/1995 | |
| JP | 4049841 | B2 | 2/2008 | |
| JP | 2012004349 | A * | 1/2012 | B05D 3/065 |
| WO | 2015/119260 | A1 | 8/2015 | |

OTHER PUBLICATIONS

Machine translation of JP 2012004349 A, no date.*
International Search Report and Written Opinion received for PCT Patent Application No. PCT/EP2021/081913, mailed on Mar. 4, 2022, 8 pages.
Thompson, "Printing Materials: Science and Technology", A Pira International printing guide, 2006, pp. 1-6.

* cited by examiner

*Primary Examiner* — Alex A Rolland
(74) *Attorney, Agent, or Firm* — Faegre Drinker Biddle & Reath LLP

(57) ABSTRACT

A method is disclosed for the preparation of a silicon nitrogeneous film. Polysilazane film is exposed to an electron beam irradiation and subsequently to at least one process selected from the group consisting of a vacuum ultra-violet light irradiation and a plasma processing. The treated film is heated under a non-oxidizing atmosphere to manufacture a silicon nitrogeneous film. The silicon nitrogeneous film is able to be formed at low process temperature. Further, the silicon nitrogeneous film has a high refractive index and low oxygen content.

5 Claims, No Drawings

METHOD OF MANUFACTURING SILICON NITROGENEOUS FILM

CROSS-REFERENCE TO RELATED APPLICATIONS

This application is a National stage application (under 35 U.S.C. § 371) of PCT/EP2021/081913, filed Nov. 17, 2021, which claims benefit of U.S. Application No. 63/116,474, filed Nov. 20, 2020, both of which are incorporated herein by reference in their entirety.

BACKGROUND OF THE INVENTION

Technical Field

The present invention relates to a manufacturing of inorganic films, with particular application to the manufacturing of silicon nitrogeneous films. Further, the present invention also relates to a manufacturing process of semiconductor devices and the like comprising the silicon nitrogeneous films.

Background Art

In the manufacture of electronic devices, especially semiconductor devices, a chemically inert dielectric material such as, silicon nitride is essential. Thin films of silicon nitride function as diffusion masks, hard masks for an etching process, oxidation barriers, trench isolation, interlayer dielectric material with high dielectric breakdown voltages. An interlayer insulating film may be formed between a transistor element and a bit line, between a bit line and a capacitor, between a capacitor and a metal wiring, between plural of metal wirings, and the like. Furthermore, it is necessary to lower the temperature of a film producing process according to demands for suppression of migration of wirings, suppression of damage of silicon wafer, thermal resistivity of materials used in an advanced device and so forth.

A chemical vapor deposition method (CVD method), a sol-gel method, a method for applying a composition comprising a silicon-containing polymer and baking, and the like are used for a method for forming a silicon nitride film. Among these, the method for forming a silicon nitride film using a composition is relatively simple.

There has been a need for a material which can fill a narrow and a high aspect ratio trench of a semiconductor device and can be converted into a silicon nitride film by curing at a low process temperature, which is bearable to acid etching and having high refractive index.

US 2009/289284 A1 discloses a method for the production of a silicon nitride film comprising, spinning-on a perhydro-polysilazane onto a substrate, baking the perhydro-polysilazane film at a temperature between 100 and 200° C. and curing the baked perhydro-polysilazane film at a temperature between 200 and 500° C. in a nitrogen gas environment.

JP 1995206410 A discloses a method for forming a silicon nitride film is characterized in that a perhydropolysilazane solution is applied on a substrate and the perhydropolysilazane film is baked at a temperature below 500° C. while being irradiated with UV light.

JP 4049841 B discloses a method for forming a silicon nitride film comprising, applying a perhydropolysilazane solution, which is prepared by dissolving a perhydropolysilazane in an organic solvent, onto a substrate to form a coating film, drying the coating film and baking the dried coating film at a temperature above 600° C. in vacuum.

U.S. Pat. No. 5,093,096 discloses a process for producing a silicon nitride fiber comprising, spinning a spinning solution of a polysilazane, irradiating the fiber in vacuo or a non-oxidizing atmosphere by an ionizing radiation beam of a dose of $5\times10^7$-$9\times10^9$ rad and firing the irradiated fiber in an ammonia gas stream at a temperature of 600-1700° C.

U.S. Pat. No. 6,426,127 B1 discloses a process for forming a dielectric coating on a substrate comprising, applying a silazane polymer containing composition onto a substrate, optionally heating the composition to evaporate any solvents therefrom, and overall irradiating the composition with electron beam radiation under conditions sufficient to cure the silazane polymer containing composition. The electron beam dose will fall into the range of from about 1 to about 500,000 $\mu C/cm^2$.

RELATED ART DOCUMENTS

Patent Document 1: US 2009/289284 A1
Patent Document 2: JP 1995206410 A
Patent Document 3: JP 4049841 B
Patent Document 4: U.S. Pat. No. 5,093,096
Patent Document 5: U.S. Pat. No. 6,426,127 B1

SUMMARY OF THE INVENTION

One embodiment of the present invention provides a method of manufacturing a silicon nitrogeneous film comprising;

- applying a silicon nitrogenous film forming composition comprising a polysilazane and a solvent above a substrate to form a coating film,
- irradiating an electron beam onto the coating film under a non-oxidizing atmosphere,
- at least one process selected from the group consisting of (a) irradiating a vacuum ultra-violet light onto the electron beam irradiated coating film under a non-oxidizing atmosphere and (b) plasma processing onto the electron beam irradiated coating film, and
- heating the treated coating film in the previous step under a non-oxidizing atmosphere.

Another embodiment of the present invention provides a silicon nitrogeneous film that can be formed in a narrow and a high aspect ratio trench.

Still another embodiment of the present invention provides a method of manufacturing an electronic device having a silicon nitrogeneous film which is bearable to acid etching.

The method of manufacturing a silicon nitrogeneous film of the present invention enables to obtain a silicon nitrogeneous film from a simple process and at a low process temperature. The silicon nitrogeneous film is able to be formed in a narrow and a high aspect ratio trench. Further, the silicon nitrogeneous film is bearable to acid etching in a manufacturing process of semiconductor devices and the like. The silicon nitrogeneous film also has a high refractive index and low oxygen content. It is possible to improve the yield of electronic devices by using the method of manufacturing a silicon nitrogeneous film.

Definitions

Unless otherwise stated, the following terms used in the specification and claims shall have the following meanings for the purpose of the present specification.

In the present specification, the use of the singular includes the plural, and the words “a”, “an” and “the” mean “at least one”, unless specifically stated otherwise. Furthermore, the use of the term “including”, as well as other forms such as “includes” and “included”, is not limiting. Also, terms such as “element” or “component” encompass both elements or components comprising one unit and elements or components that comprise more than one unit, unless specifically stated otherwise. As used herein, the conjunction “and” is intended to be inclusive and the conjunction “or” is not intended to be exclusive, unless otherwise indicated. For example, the phrase “or, alternatively” is intended to be exclusive. As used herein, the term “and/or” refers to any combination of the foregoing elements including using a single element.

The term “about” or “approximately,” when used in connection with a measurable numerical variable, refers to the indicated value of the variable and to all values of the variable that are within the experimental error of the indicated value (e.g., within the 95% confidence limit for the mean) or within ±10 percent of the indicated value, whichever is greater.

In the present specification, the descriptions such as “$C_{x-y}$”, “$C_x$-$C_y$” and “$C_x$” mean the number of carbon atoms in a molecule or substituent. For example, $C_{1-6}$ alkyl means alkyl having not less than 1 and not more than 6 carbons (methyl, ethyl, propyl, butyl, pentyl, hexyl etc.).

In the present specification, unless otherwise specifically mentioned, “alkyl” means a linear or branched alkyl, and “cycloalkyl” means alkyl containing a cyclic structure. Those in which a cyclic structure is substituted with a linear or branched alkyl are also referred to as cycloalkyl. Further, those having a polycyclic structure such as bicycloalkyl are also included in cycloalkyl. “Heteroalkyl” means alkyl containing oxygen or nitrogen in the main chain or side chain unless otherwise specifically mentioned and means, for example, alkyl including oxy, hydroxy, amino, carbonyl and the like. Further, “hydrocarbyl group” means a monovalent, divalent or higher group comprising carbon and hydrogen and optionally containing oxygen or nitrogen. Furthermore, in the present specification, unless otherwise specifically mentioned, “alkylene” means a divalent group corresponding to said alkyl and includes, for example, a linear alkylene or a branched alkylene having a side chain.

In the present specification, “silicon nitrogeneous” means an amorphous chemical compound comprising silicon-nitrogen bond, which can contain hydrogen, oxygen or carbon.

In the case of numerical range is described with “to”, “-” or “~”, these include end points and units are common. For example, 5-25 mol % refers to that 5 mol % or more and 25 mol % or less.

In the present specification, “non-oxidizing atmosphere” means an atmosphere having an oxygen concentration of 1 ppm or less and a dew point of −76° C. or lower.

In the present specification, in the case polymer comprises plural kinds of repeating units without any specific definitions, these repeating units copolymerize. These copolymerizations can take alternating copolymerization, random copolymerization, block copolymerization, graft copolymerization, or any mixture of thereof.

In the present specification, unless otherwise specifically mentioned, Celsius is used as the temperature unit. For example, 20 degrees means 20 degrees Celsius.

In the present specification, unless otherwise specifically mentioned, “%” means “% by mass” and “parts” means “parts by mass”.

The section headings used herein are for organizational purposes and are not to be construed as limiting the subject matter described. All documents, or portions of documents, cited in this application, including, but not limited to, patents, patent applications, articles, books, and treatises, are hereby expressly incorporated herein by reference in their entirety for any purpose. In the event that one or more of the incorporated literatures and similar materials defines a term in a manner that contradicts the definition of that term in this application, this application controls.

DETAILED DESCRIPTION OF THE INVENTION

Embodiments of the present invention are described below in detail.

Method of Manufacturing Silicon Nitrogeneous Film

The method of manufacturing a silicon nitrogeneous film according to the present invention comprises:

- applying a silicon nitrogenous film forming composition comprising a polysilazane and a solvent above a substrate to form a coating film,
- irradiating an electron beam onto the coating film under a non-oxidizing atmosphere,
- at least one process selected from the group consisting of (a) irradiating a vacuum ultra-violet light onto the electron beam irradiated coating film under a non-oxidizing atmosphere and (b) plasma processing onto the electron beam irradiated coating film, and
- heating the treated coating film in the previous step under a non-oxidizing atmosphere.

Silicon Nitrogenous Film Forming Composition

The silicon nitrogenous film forming composition of the present invention comprises a polysilazane and a solvent.

The polysilazane used in the manufacturing method according to the present invention can be freely selected unless it impairs the effects of the present invention. These are either inorganic compounds or organic compounds, and can be linear, branched, or partially having a cyclic structure.

Preferably, the polysilazane comprises a repeating unit represented by the following formula (1):

(1)

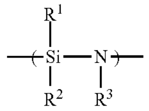

wherein $R^1$ to $R^3$ are each independently a single bond, hydrogen or $C_{1-4}$ alkyl.

More preferably, the polysilazane used in the manufacturing method according to the present invention is perhydropolysilazane (hereinafter referred to as “PHPS”). The PHPS is a silicon-containing polymer comprising Si—N bonds as repeating units and consisting only of Si, N and H. In this PHPS, except for Si—N bonds, all elements binding to Si and N are H, and any other elements such as carbon and oxygen are not substantially contained.

PHPS has a branched structure or a cyclic structure in the molecule, and an example of a specific partial structure of such PHPS is shown in the following formula.

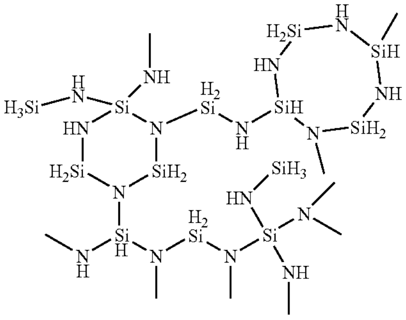

From the viewpoint of solubility in solvents and reactivity, the mass average molecular weight of the polysilazane used in the manufacturing method according to the present invention is preferably 900 to 15,000, and more preferably 900 to 10,000. The mass average molecular weight is a mass average molecular weight in terms of polystyrene, and it can be measured by gel permeation chromatography based on polystyrene.

A wide variety of solvents can be used to prepare the composition. Suitable solvents include, but are not limited to, aromatic compounds such as benzene, toluene, xylene, ethylbenzene, diethylbenzene, trimethylbenzene and triethylbenzene; saturated hydrocarbon compounds such as cyclohexane, decahydronaphthalene, dipentene, n-pentane, i-pentane, n-hexane, i-hexane, n-heptane, i-heptane, n-octane, i-octane, n-nonane, i-nonane, n-decane, ethylcyclohexane, methylcyclohexane, cyclohexane and p-menthane; unsaturated hydrocarbon compounds such as cyclohexene; ether compounds such as dipropyl ether, dibutyl ether and anisole; ester compounds such as n-butyl acetate, i-butyl acetate, n-amyl acetate and i-amyl acetate; ketone compounds such as methyl isobutyl ketone (MIBK). Solvent can be used singly or in combination of two or more. By using plural kinds of solvents, it is possible to adjust the solubility of the polysilazane and the evaporation rate of the solvent.

Considering the workability of the adopted coating method and the permeability of the composition into a fine trench and the film thickness required outside of the trench, the amount of the solvent in the composition can be appropriately selected according to the mass average molecular weight of the employed polysilazane. The composition of the present invention generally contains from 1 to 50 mass %, preferably from 1 to 30 mass % of the polysilazane based on the total mass of the composition.

The composition used in the manufacturing method according to the present invention can contain optional components, for example, surfactants and the like. Since the surfactant can improve coatability, it is preferable to be used. Examples of the surfactant that can be used in the composition of the present invention include nonionic surfactants, anionic surfactants, amphoteric surfactants, and the like.

Examples of the nonionic surfactant include, polyoxyethylene alkyl ethers, such as polyoxyethylene lauryl ether, polyoxyethylene oleyl ether and polyoxyethylene cetyl ether; polyoxyethylene fatty acid diester; polyoxy fatty acid monoester; polyoxyethylene polyoxypropylene block polymer; acetylene alcohol; acetylene glycol; acetylene alcohol derivatives such as polyethoxylate of acetylene alcohol; acetylene glycol derivatives such as polyethoxylate of acetylene glycol; fluorine-containing surfactants such as Fluorad (trade name, manufactured by 3M Japan Limited), Megafac (trade name, manufactured by DIC Corporation), Surufuron (trade name, manufactured by Asahi Glass Co., Ltd.); or organosiloxane surfactants, such as KP341 (trade name, manufactured by Shin-Etsu Chemical Co., Ltd.). Examples of said acetylene glycol include 3-methyl-1-butyne-3-ol, 3-methyl-1-pentyn-3-ol, 3,6-dimethyl-4-octyne-3,6-diol, 2,4,7,9-tetramethyl-5-decyne-4,7-diol, 3,5-dimethyl-1-hexyne-3-ol, 2,5-dimethyl-3-hexyne-2,5-diol, 2,5-dimethyl-2,5-hexane-diol and the like.

Examples of the anionic surfactant include ammonium salt or organic amine salt of alkyl diphenyl ether disulfonic acid, ammonium salt or organic amine salt of alkyl diphenyl ether sulfonic acid, ammonium salt or organic amine salt of alkyl benzene sulfonic acid, ammonium salt or organic amine salt of polyoxyethylene alkyl ether sulfuric acid, ammonium salt or organic amine salt of alkyl sulfuric acid and the like.

Examples of the amphoteric surfactant include 2-alkyl-N-carboxymethyl-N-hydroxyethyl imidazolium betaine, lauric acid amide propyl hydroxysulfone betaine and the like.

These surfactants can be used alone or as a mixture of two or more kinds, and the mixing ratio thereof is usually 50 to 10,000 ppm, preferably 100 to 5,000 ppm, based on the total mass of the composition.

Applying Silicon Nitrogenous Film Forming Composition

A method for applying the silicon nitrogenous film forming composition to such a substrate is not particularly limited and includes usual methods for coating, for example, a spin coating, a dip coating, a spray coating, a transfer method, a roll coating, a bar coating, a doctor coating, a brush coating, a flow coating, or a slit coating, and the like. A suitable substrate on which the composition is applied is, for example, a silicon substrate, a glass substrate and a resin film. Semiconductor elements and the like can be formed on these substrates as necessary.

After applying the silicon nitrogenous film forming composition, for the purposes of drying the coating film, a prebaking step is preferably carried out. The prebaking step is carried out in air or preferably in a non-oxidizing atmosphere. The processing conditions are, for example, at 50 to 200° C. for 10 seconds to 30 minutes on a hotplate.

Irradiating Electron Beam

The coating film formed from the silicon nitrogenous film forming composition is exposed to an electron beam. The electron beam is generated from a tube current of 0.1 to 10 mA, preferably 0.1 to 8 mA. An accelerating voltage is 50 to 100 kV, preferably 50 to 80 kV. When the accelerating voltage is below 50 kV, the conversion into a silicon nitrogenous film around the bottom of the coating film is insufficient according to the film thickness. When the accelerating voltage is above 100 kV, semiconductor element could be affected.

An irradiation dose of the electron beam is 10 to 100 MGy, preferably 10 to 80 MGy.

The electron beam irradiation is conducted at 20-100° C. under a non-oxidizing atmosphere. The non-oxidizing atmosphere means an atmosphere having an oxygen concentration of 1 ppm or less and a dew point of −76° C. or lower. Preferably, a gas atmosphere of N2, Ar, He, Ne, H2, or a mixture of two or more of any of these is used.

Post-Treatment of the Electron Beam Irradiated Film (a) The electron beam irradiated film is exposed to a vacuum ultra-violet light. A vacuum ultra-violet light having a wavelength of 100-200 nm is preferably used as vacuum ultra-violet light radiation of the present invention. Examples of an apparatus to generate vacuum ultra-violet light include: a low-pressure mercury lamp, an excimer lamp (a single wavelength of 126 nm (Ar), 146 nm (Kr), 165 nm (ArBr), 172 nm (Xe), and 193 nm (ArF)). Among them, a Xe excimer lamp which emits wavelength of 172 nm is preferably used in the present invention.

An illuminance of the vacuum ultra-violet light is in the range of 1 to 200 mW/cm$^2$, preferably, in the range of 10 to 100 mW/cm$^2$. The vacuum ultra-violet light dose is in the range of 3 to 15 J/cm$^2$, preferably, in the range of to 12 J/cm$^2$.

The vacuum ultra-violet light irradiation is conducted at 10-100° C. under a non-oxidizing atmosphere. Preferably, a gas atmosphere of $N_2$, Ar, He, Ne, $H_2$, or a mixture of two or more of any of these is used.

The electron beam irradiation and the vacuum ultra-violet light irradiation is conducted by using EB-ENGIN L12978 (Hamamatsu Photonics K. K.) equipped with a vacuum ultra-violet light (172 nm) irradiation equipment (M.D-.COM Inc.).

(b) The electron beam irradiated film is conducted to a plasma processing. The plasma is generated from a gas introduced in a plasma processing chamber. Examples of the gas including, but not limited to, $N_2$, $H_2$, He, Ar, Ne, Xe, carbon-containing gas, chlorine-containing gas, and any of a mixture thereof. Among such gases, $N_2$ or Ar is preferable. The plasma processing is performed for preferably for 10-60 minutes, more preferably for 15-45 minutes at substrate temperature preferably 50 to 300° C., more preferably 80 to 250° C. Pressure in the chamber is preferably 0.1 Pa to 0.4 MPa, more preferably 1 Pa to 0.3 MPa. Gas-supply flow rate is preferably 5,000 to 50,000 standard cc/min (sccm), more preferably 10,000 to 30,000 sccm.

Heating the Treated-Coating Film

The treated-coating film is heated under a non-oxidizing atmosphere. Preferably, a gas atmosphere of $N_2$, Ar, He, Ne, Hz, or a mixture of two or more of any of these is used. Heating can be carried out within a temperature range from 300 to 800° C. Film properties of the silicon nitrogeneous film of the present invention is affected by the heating at a temperature below 300° C. The heating is carried out in a furnace VF-1000 (Koyo Thermo Systems Co., Ltd.).

The heating rate to the target temperature and the cooling rate during the heating are not particularly limited and can be generally within a range from 1° C. to 100° C./min. In addition, holding time after reaching the target temperature is not also limited in particular, and it can be generally within a range from 1 minute to 10 hours.

Film thickness of the silicon nitrogeneous film of the present invention is not specifically limited but preferably 0.1-1.2 μm, more preferably 0.1-1.0 μm.

Refractive index of the silicon nitrogeneous film of the present invention is 1.75-2.00, preferably 1.80-2.00 measured by a spectroscopic ellipsometer (M-2000V JA Woollam Co., Inc.). Silicon, nitrogen and oxygen content is measured by an X-ray photoelectron spectrometer (PHI Quanterall ULVAC PHI, Inc.). Oxygen content of the silicon nitrogeneous film based on total mass of silicon, nitrogen and oxygen is 0.5-7 mass %, preferably 0.5-6 mass %.

Method for producing an electronic device of the present invention comprises the above described method. Preferably the device is a semiconductor device, solar cell chip, organic light emitting diode and inorganic light emitting diode. One preferable embodiment of the device of this invention is a semiconductor device.

EXAMPLES

Hereinafter, the present invention will be described with working examples. These examples are given only for illustrative purpose and not intended to limit the scope of the present invention.

Synthesis Example 1

The inside of a 10 L reaction vessel, equipped with a cooling condenser, a mechanical stirrer and a temperature controller, is replaced with dry nitrogen and thereafter 7,500 mL of dry pyridine is put into the reaction vessel, which is then cooled down to −3° C. Then, 500 g of dichlorosilane is added to produce a white color solid adduct ($SiH_2Cl_2 \cdot 2C_5H_5N$). Upon confirming that the reaction mixture became −3° C. or less, 350 g of ammonia is slowly blown into the reaction mixture while stirring. Subsequently, stirring is continued for 30 minutes, and then dry nitrogen is blown into the liquid layer for 30 minutes to remove excess ammonia. The resulting slurry product is subjected to pressure filtration using 0.2 μm filter made of Teflon (registered trademark) under dry nitrogen atmosphere to obtain 6,000 ml of filtrate. Pyridine is distilled off using an evaporator to obtain a xylol solution of the inorganic polysilazane having 38.9% concentration.

The inside of a 10 L reaction vessel, equipped with a cooling condenser, a mechanical stirrer and a temperature controller, is replaced with dry nitrogen, and thereafter 4680 g of dry pyridine, 151 g of dry xylol and 1673 g of the 38.9% reaction product are introduced. They are stirred to be made uniform while bubbling nitrogen gas at 0.5 NL/min. Subsequently, a reforming reaction is performed at 100° C. for 13 hours to obtain a perhydropolysilazane having a weight-average molecular weight of 4266.

Synthesis Example 2

The inside of a 10 L reaction vessel, equipped with a cooling condenser, a mechanical stirrer and a temperature controller, is replaced with dry nitrogen and thereafter 7,500 mL of dry pyridine is put into the reaction vessel, which is then cooled down to −3° C. 500 g of dichlorosilane is added to produce a white color solid adduct ($SiH_2Cl_2 \cdot 2C_5H_5N$). Upon confirming that the reaction mixture became −3° C. or less, the mixture solution is stirred for one hour and 470 g of methylamine is blown into the solution and aminolysis is performed at a reaction temperature of −3° C. for 100 minutes. Subsequently, 80 g of ammonia is slowly blown into the reaction mixture while stirring, followed by stirring for 30 minutes while maintaining the temperature at −3° C. and then dry nitrogen is blown into the liquid layer for 30 minutes to remove excess ammonia. The resulting slurry product is subjected to pressure filtration using 0.2 μm filter made of Teflon (registered trademark) under dry nitrogen atmosphere to obtain 6,000 ml of filtrate. Pyridine is distilled off using an evaporator to obtain a xylol solution of the N-methyl polysilazane having a weight average molecular weight (Mw) of 1,700 and concentration. By the FT-IR spectrum measurement of the resin obtained, production of a polysilazane compound containing a methylamine skeleton is confirmed and the NH/SiH ratio of the resin is From the $^1H$ NMR spectrum, the NMe/$SiH_{1,2}$ ratio is 0.21 and the $SiH_3$/$SiH_{1,2}$ ratio is 0.11.

Example 1

The perhydropolysilazane solution of Synthesis Example 1 is diluted with xylene to 7.5 mass % solution and is spin-coated on a silicon wafer by using 1HDX2 (Mikasa Co. Ltd.). The coating film is prebaked at 80° C. for 3 minutes on a hotplate under nitrogen atmosphere. The prebaked film is exposed to an electron beam by using EB-ENGIN L12978 (Hamamatsu Photonics K.K.) equipped with a vacuum ultra-violet light (172 nm) irradiation equipment (M.D.COM Inc.). The electron beam irradiation is conducted at 25° C. under $N_2$ atmosphere. The electron beam is generated from a tube current of 7.5 mA. An accelerating voltage is 70 kV and an irradiation dose of the electron beam is 60 MGy.

The electron beam irradiated film is exposed to a vacuum ultra-violet light having a wavelength of 172 nm by using EB-ENGIN L12978 (Hamamatsu Photonics K.K.) equipped with a vacuum ultra-violet light (172 nm) irradiation equipment (M.D.COM Inc.). An illuminance of the vacuum ultra-violet light is 25 mW/cm$^2$ and the vacuum ultra-violet light dose is 9 J/cm$^2$. The vacuum ultra-violet light irradiation is conducted at 25° C. under $N_2$ atmosphere.

The vacuum ultra-violet light irradiated film is heated under a non-oxidizing atmosphere at 450° C. for 90 minutes. A silicon nitrogeneous film has refractive index of 1.82 and film thickness of 0.28 μm. Oxygen content of the silicon nitrogeneous film is 4.6 mass %.

A silicon substrate having a trench structure with a width of 20 nm and a depth of 500 nm on the surface is prepared. A silicon nitrogeneous film is prepared by the above-described method. The silicon substrate with the silicon nitrogeneous film is cut perpendicularly to the trench direction. The silicon substrate strip is immersed into 0.5% hydrofluoric acid aqueous solution for 30 seconds. The cross section is observed by a scanning electron microscope. Bottom of the trench is bearable to hydrofluoric acid aqueous solution

Example 2

The N-methylpolysilazane solution of Synthesis Example 2 is diluted with xylene to 9.0 mass % solution and is spin-coated on a silicon wafer by using 1HDX2 (Mikasa Co. Ltd.). The coating film is prebaked at 80° C. for 3 minutes on a hotplate under nitrogen atmosphere. The prebaked film is exposed to an electron beam by using EB-ENGIN L12978 (Hamamatsu Photonics K.K.) equipped with a vacuum ultra-violet light (172 nm) irradiation equipment (M.D.COM Inc.). The electron beam irradiation is conducted at 25° C. under $N_2$ atmosphere. The electron beam is generated from a tube current of 7.5 mA. An accelerating voltage is 70 kV and an irradiation dose of the electron beam is 15 MGy.

The electron beam irradiated film is exposed to a vacuum ultra-violet light having a wavelength of 172 nm by using EB-ENGIN L12978 (Hamamatsu Photonics K.K.) equipped with a vacuum ultra-violet light (172 nm) irradiation equipment (M.D.COM Inc.). An illuminance of the vacuum ultra-violet light is 25 mW/cm$^2$ and the vacuum ultra-violet light dose is 10 J/cm$^2$. The vacuum ultra-violet light irradiation is conducted at 25° C. under $N_2$ atmosphere.

The vacuum ultra-violet light irradiated film is heated under a non-oxidizing atmosphere at 600° C. for 90 minutes. A silicon nitrogeneous film has refractive index of 1.88 and film thickness of 0.31 μm. Oxygen content of the silicon nitrogeneous film is 3.0 mass %.

Example 3

The perhydropolysilazane solution of Synthesis Example 1 is diluted with xylene to 10.0 mass % solution and is spin-coated on a silicon wafer by using 1HDX2 (Mikasa Co. Ltd.). The coating film is prebaked at 80° C. for 3 minutes on a hotplate under nitrogen atmosphere. The prebaked film is exposed to an electron beam by using EB-ENGIN L12978 (Hamamatsu Photonics K.K.) equipped with a vacuum ultra-violet light (172 nm) irradiation equipment (M.D.COM Inc.). The electron beam irradiation is conducted at 25° C. under $N_2$ atmosphere. The electron beam is generated from a tube current of 7.5 mA. An accelerating voltage is 70 kV and an irradiation dose of the electron beam is 96 MGy.

The electron beam irradiated film is exposed to a vacuum ultra-violet light having a wavelength of 172 nm by using EB-ENGIN L12978 (Hamamatsu Photonics K.K.) equipped with a vacuum ultra-violet light (172 nm) irradiation equipment (M.D.COM Inc.). An illuminance of the vacuum ultra-violet light is 25 mW/cm$^2$ and the vacuum ultra-violet light dose is 7 J/cm$^2$. The vacuum ultra-violet light irradiation is conducted at 25° C. under $N_2$ atmosphere.

The vacuum ultra-violet light irradiated film is heated under a non-oxidizing atmosphere at 800° C. for 90 minutes. A silicon nitrogeneous film has refractive index of 1.95 and film thickness of 0.25 μm. Oxygen content of the silicon nitrogeneous film is 0.8 mass %.

Example 4

A plasma processing is performed on the electron beam irradiated film of Example 1. The electron beam irradiated film is placed in an atmospheric pressure plasma surface treatment device AP-T02 (Sekisui Chemical Co., Ltd.). The direct plasma processing is conducted at 200° C. for 30 minutes. Pressure in the chamber is 0.1 MPa and voltage between electrodes is 15 kV. Gas-supply flow rate is 20,000 sccm of 96 vol % $N_2$ and 4 vol % $H_2$.

The plasma processed film is heated under a non-oxidizing atmosphere at 450° C. for 90 minutes. A silicon nitrogeneous film has refractive index of 1.79 and film thickness of 0.25 μm. Oxygen content of the silicon nitrogeneous film is 4.9 mass %.

Comparative Example 1

The perhydropolysilazane solution of Synthesis Example 1 is diluted with xylene to 7.5 mass % solution and is spin-coated on a silicon wafer by using 1HDX2 (Mikasa Co. Ltd.). The coating film is prebaked at 80° C. for 3 minutes on a hotplate under nitrogen atmosphere. The prebaked film is exposed to an electron beam by using EB-ENGIN L12978 (Hamamatsu Photonics K.K.) equipped with a vacuum ultra-violet light (172 nm) irradiation equipment (M.D.COM Inc.). The electron beam irradiation is conducted at 25° C. under $N_2$ atmosphere. The electron beam is generated from a tube current of 7.5 mA. An accelerating voltage is 70 kV and an irradiation dose of the electron beam is 60 MGy.

The electron beam irradiated film is heated under a non-oxidizing atmosphere at 450° C. for 90 minutes. A silicon nitrogeneous film has refractive index of 1.64. Oxygen content of the silicon nitrogeneous film is 24.2 mass %.

The results of Example 1-4 and Comparative Example 1 are shown in Table 1.

TABLE 1

| | Si content (mass %) | N content (mass %) | O content (mass %) | Refractive index | Fbd (MV/cm) |
|---|---|---|---|---|---|
| Example 1 | 68.9 | 25.6 | 4.6 | 1.82 | 3.44 |
| Example 2 | 70.8 | 26.2 | 3.0 | 1.88 | 5.38 |

TABLE 1-continued

| | Si content (mass %) | N content (mass %) | O content (mass %) | Refractive index | Fbd (MV/cm) |
|---|---|---|---|---|---|
| Example 3 | 72.5 | 26.7 | 0.8 | 1.95 | 6.25 |
| Example 4 | 69.1 | 25.3 | 4.9 | 1.79 | 3.32 |
| Comparative Example 1 | 59.1 | 16.7 | 24.2 | 1.64 | 2.50 |

Mass Average Molecular Weight

Gel permeation chromatography (GPC) is measured using Alliance e2695 High Performance GPC system (Nihon Waters K.K.) and Super Multipore HZ-N GPC column (Tosoh Corporation). The measurement is performed using monodispersed polystyrene as a standard sample and chloroform as an eluent, under the conditions of a flow rate of 0.6 mL/min and a column temperature of 40° C., and thereafter calculating the mass average molecular weight as a relative molecular weight to the standard sample.

Silicon, Nitrogen and Oxygen Content

Silicon, nitrogen and oxygen content of the silicon nitrogeneous film is measured using an X-ray photoelectron spectrometer (PHI Quanterall ULVAC PHI, Inc.). Each element content (mass %) is calculated based on total mass of silicon, nitrogen and oxygen.

Film Thickness and Refractive Index

Film thickness and refractive index of the silicon nitrogeneous film are measured with a spectroscopic ellipsometer (M-2000V JA Woollam Co., Inc.).

Electrical Breakdown Field (Fbd)

Electrical breakdown field of the silicon-containing film of 200 nm film thickness is measured using SSM495 272A-M100 (Japan SSM K.K.). The electric field when the current density exceeds $1E^{-6}$ ($A/cm^2$) is taken as Fbd (MV/cm).

The invention claimed is:

1. A method for manufacturing a silicon nitrogenous film comprising:

(i) applying a silicon nitrogenous film forming composition comprising a polysilazane and a solvent above a substrate to form a coating film, (ii) irradiating an electron beam with an accelerating voltage in the range from 50 to 100 kV onto the coating film under a non-oxidizing atmosphere, (iii) at least one process selected from the group consisting of a) irradiating a vacuum ultra-violet light with a wavelength of 100 to 200 nm onto the electron beam irradiated coating film under a gas atmosphere of $N_2$ at 10-100° C., where the vacuum ultra-violet light has an illuminance in the range of 1 to 200 $mW/cm^2$, the vacuum ultra-violet light has a dose in the range of 3 to 15 $J/cm^2$, and b) plasma processing onto the electron beam irradiated coating film for 10-60 minutes at a substrate temperature of 50 to 300° C., where the plasma is generated from a mixture of $N_2$ and $H_2$ introduced into a plasma processing chamber at a flow rate of 5,000 to 50,000 sccm, and (iv) heating the treated-coating film of step (iii) under a non-oxidizing atmosphere, wherein an irradiation dose of the electron beam is 10 MGy to 100 MGy.

2. The method according to claim 1, wherein the polysilazane comprises a repeating unit represented by the following formula (1):

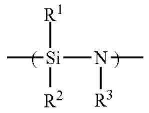

(1)

wherein $R^1$ to $R^3$ are each independently a single bond, hydrogen or $C_{1-4}$ alkyl.

3. The method according to claim 1, wherein the mass average molecular weight of the polysilazane is 900 to 15,000 measured by gel permeation chromatography in terms of polystyrene.

4. The method according to claim 1, wherein the polysilazane is perhydropolysilazane.

5. The method according to claim 1, wherein the heating in (iv) is performed at 300 to 800° C.

* * * * *